United States Patent
Patel

(10) Patent No.: US 11,812,588 B2
(45) Date of Patent: *Nov. 7, 2023

(54) MANAGING AIRFLOW FOR COMPUTING DEVICES

(71) Applicant: Core Scientific, Inc., Bellevue, WA (US)

(72) Inventor: Harsh Patel, Stone Mountain, GA (US)

(73) Assignee: Core Scientific Operating Company, Austin, TX (US)

( * ) Notice: Subject to any disclaimer, the term of this patent is extended or adjusted under 35 U.S.C. 154(b) by 76 days.

This patent is subject to a terminal disclaimer.

(21) Appl. No.: 17/095,310

(22) Filed: Nov. 11, 2020

(65) Prior Publication Data

US 2022/0142008 A1 May 5, 2022

Related U.S. Application Data

(60) Provisional application No. 63/108,651, filed on Nov. 2, 2020.

(51) Int. Cl.
*H05K 7/20* (2006.01)
*G06F 1/20* (2006.01)

(52) U.S. Cl.
CPC .......... *H05K 7/20836* (2013.01); *G06F 1/20* (2013.01); *H05K 7/20172* (2013.01); *H05K 7/20736* (2013.01)

(58) Field of Classification Search
CPC .......... H05K 7/20836; H05K 7/20172; H05K 7/20736; G06F 1/20

(Continued)

(56) References Cited

U.S. PATENT DOCUMENTS 3,363,534 A   1/1968   Spradling
3,614,922 A   10/1971  Sobin
(Continued)

FOREIGN PATENT DOCUMENTS

WO   02104090 A1   12/2002
WO   2013039645    3/2013

OTHER PUBLICATIONS

Cindy Kiddy: "psd1212ptb1 SUNON", Taiwan (ROC), Dec. 31, 2010, pp. 1-14, XP055657800, retrieved Jan. 14, 2020.

(Continued)

*Primary Examiner* — Chun Cao
(74) *Attorney, Agent, or Firm* — Fishman Stewart PLLC

(57) ABSTRACT

Systems and methods for managing airflow for cooling computing devices in a data center in normal and cold environments are disclosed. Computing devices are positioned on racks, and an air barrier may be connected to the racks and have openings configured to permit air to be drawn through the computing devices by cooling fans. In a first mode, cool air may be drawn in from a cold aisle, and heated air may be exhausted into a hot aisle. Temperature sensors may periodically measure temperatures for the cool air being drawn into the computing devices. A controller may select a subset of the computing devices for air flow reversal in response to the measured temperatures being below a predetermined threshold. Patterns that may be time-varying and temperature-varying may be used to select the computing devices for air flow reversal and to adjust the fan speed of the computing devices.

20 Claims, 6 Drawing Sheets

(58) Field of Classification Search
USPC ........................................................ 700/300
See application file for complete search history.

(56) References Cited

U.S. PATENT DOCUMENTS

| | | | |
|---|---|---|---|
| 4,872,504 | A | 10/1989 | Huebner |
| 6,135,875 | A | 10/2000 | French |
| 6,483,699 | B1 | 11/2002 | Salmonson et al. |
| 8,223,495 | B1 | 7/2012 | Carlson et al. |
| 8,659,895 | B1 | 2/2014 | Carlson et al. |
| 8,857,204 | B2 | 10/2014 | Reytblat |
| 8,914,155 | B1* | 12/2014 | Shah .................. H05K 7/20836 700/282 |
| 8,943,757 | B2 | 2/2015 | Parizeau et al. |
| 9,313,929 | B1 | 4/2016 | Malone et al. |
| 9,476,657 | B1 | 10/2016 | Pettis et al. |
| 9,554,491 | B1 | 1/2017 | Wong et al. |
| 9,629,285 | B1 | 4/2017 | Lachapelle et al. |
| 9,674,988 | B2 | 6/2017 | Dernis et al. |
| 9,677,777 | B2 | 6/2017 | Karamanos et al. |
| 9,820,411 | B2* | 11/2017 | Alshinnawi ............ H05K 7/207 |
| 10,942,195 | B1* | 3/2021 | Kom ................... H05K 7/20572 |
| 10,959,349 | B1* | 3/2021 | Patel .................. H05K 7/20209 |
| 2008/0055848 | A1 | 3/2008 | Hamburgen et al. |
| 2009/0310300 | A1 | 12/2009 | Chrysler |
| 2010/0188810 | A1 | 7/2010 | Andersen et al. |
| 2011/0128699 | A1* | 6/2011 | Heydari ............. H05K 7/20836 361/679.48 |
| 2011/0138708 | A1 | 6/2011 | Chazelle et al. |
| 2012/0024502 | A1 | 2/2012 | Khalifa et al. |
| 2012/0142265 | A1 | 6/2012 | Wei |
| 2012/0197828 | A1 | 8/2012 | Yi |
| 2012/0258654 | A1 | 10/2012 | Peng et al. |
| 2013/0062047 | A1 | 3/2013 | Vaney et al. |
| 2013/0244563 | A1 | 9/2013 | Noteboom et al. |
| 2014/0069127 | A1 | 3/2014 | Bailey et al. |
| 2014/0133092 | A1 | 5/2014 | Leckelt et al. |
| 2015/0099449 | A1 | 4/2015 | Chen et al. |
| 2015/0241888 | A1 | 8/2015 | Kodama |
| 2015/0327408 | A1 | 11/2015 | Ruiz et al. |
| 2016/0021782 | A1 | 1/2016 | Kurosaki et al. |
| 2016/0081232 | A1* | 3/2016 | Zhu .................... H05K 7/20718 361/679.49 |
| 2016/0128226 | A1 | 5/2016 | Stellick et al. |
| 2016/0192542 | A1 | 6/2016 | LeFebvre et al. |
| 2016/0249484 | A1 | 8/2016 | Parizeau et al. |
| 2017/0042067 | A1 | 2/2017 | Parizeau et al. |
| 2017/0176029 | A1 | 6/2017 | Wilding et al. |
| 2017/0196125 | A1 | 7/2017 | Crosby, Jr. et al. |
| 2017/0269648 | A1 | 9/2017 | Ruiz et al. |
| 2017/0367223 | A1* | 12/2017 | Bailey ................ H05K 7/20745 |
| 2018/0077822 | A1 | 3/2018 | Sloan et al. |
| 2021/0307211 | A1* | 9/2021 | Egger .................... G06N 3/084 |

OTHER PUBLICATIONS

ISR dated Jan. 23, 2020 for Int'l Appl PCT/US2019/044673.
PCT Partial ISR dated Nov. 11, 2019 for Int'l Appl PCT/US2019/044673.
Co-Pending U.S. Appl. No. 17/095,335, filed Nov. 11, 2020.
Co-Pending U.S. Appl. No. 17/095,329, filed Nov. 11, 2020.
Co-Pending U.S. Appl. No. 17/150,340, filed Jan. 15, 2021.

* cited by examiner

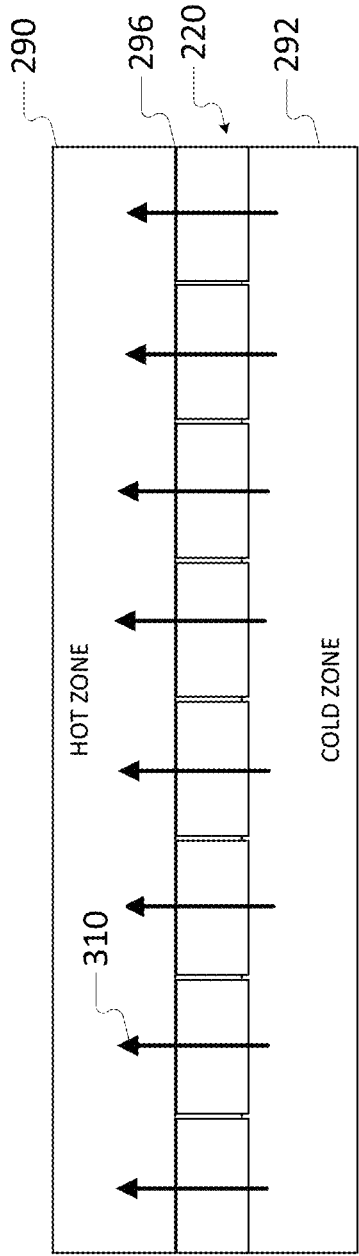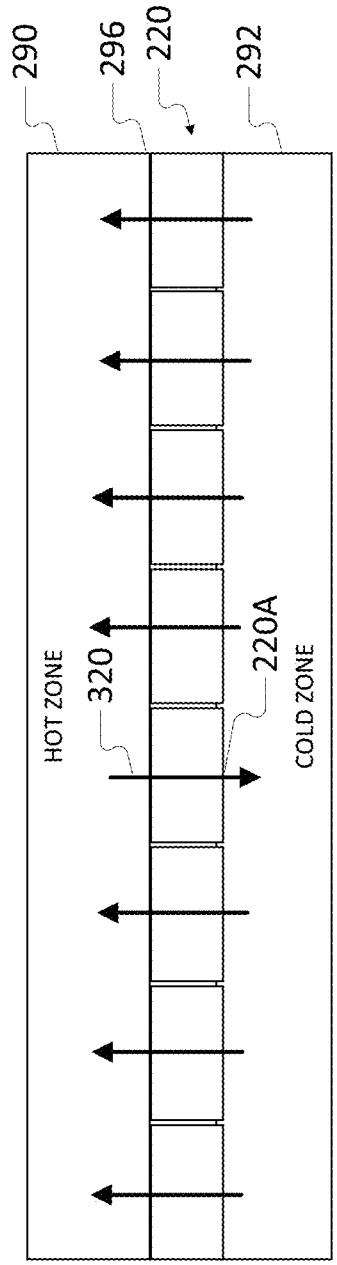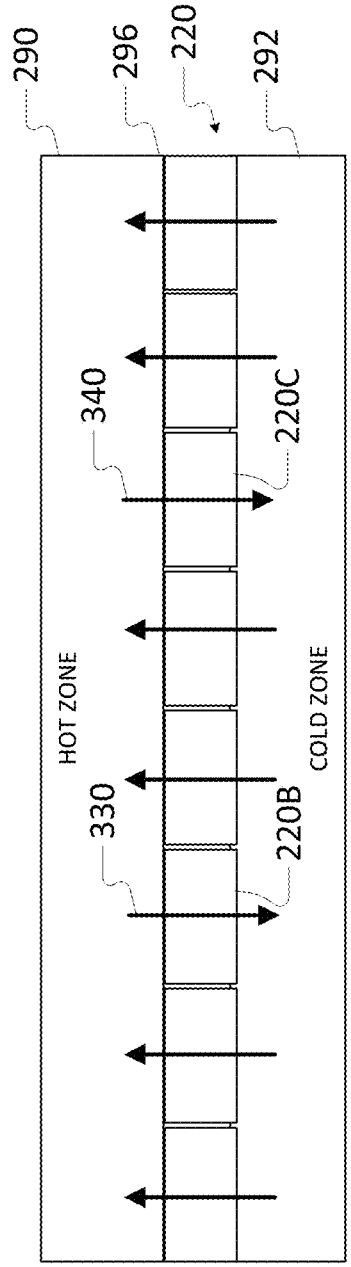

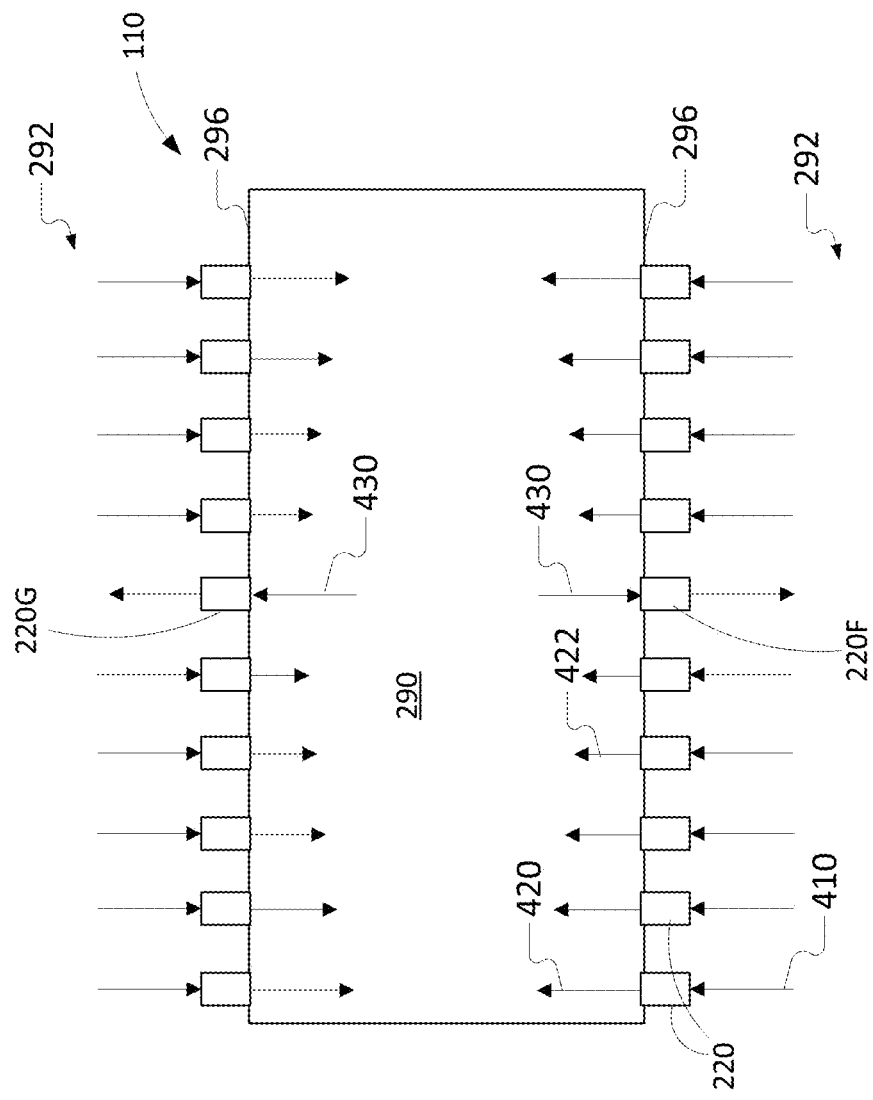

MANAGING AIRFLOW FOR COMPUTING DEVICES

CROSS-REFERENCE TO RELATED APPLICATIONS

This application claims the benefit of U.S. Provisional Patent Application Ser. No. 63/108,651, filed on Nov. 2, 2020, titled "MANAGING AIRFLOW FOR COMPUTING DEVICES", the contents of which are hereby incorporated by reference in their entirety.

TECHNICAL FIELD

The present disclosure generally relates to the field of computing and, more particularly, to systems and methods for managing airflow for groups of computing devices, such as in a data center.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Many blockchain networks (e.g., those used for cryptocurrencies like Bitcoin) require computationally difficult problems to be solved as part of a hash calculation. The difficult problem requires a solution that is a piece of data which is difficult (costly, time-consuming) to produce, but is easy for others to verify and which satisfies certain requirements. This is often called "proof of work". A proof of work (PoW) system (or protocol, or function) is a consensus mechanism. It deters denial of service attacks and other service abuses such as spam on a network by requiring some work from the service requester, usually meaning processing time by a computer.

Participants in the network operate standard PCs, servers, or specialized computing devices called mining rigs or miners. Because of the difficulty involved and the amount of computation required, the miners are typically configured with specialized components that improve the speed at which mathematical hash functions or other calculations required for the blockchain network are performed. Examples of specialized components include application specific integrated circuits (ASICs), field programmable gate arrays (FPGAs), graphics processing units (GPUs) and accelerated processing unit (APUs).

Miners are often run for long periods of time at high frequencies that generate large amounts of heat. Even with cooling (e.g., high speed fans), the heat and constant operation can negatively impact the reliability and longevity of the components in the miners. ASIC miners for example have large numbers of hashing chips (e.g., 100's) that are more likely to fail as temperatures rise.

Many participants in blockchain networks operate large numbers (e.g., 100's, 1000's or more) of different miners (e.g., different generations of miners from one manufacturer or different manufacturers) concurrently in large data centers. Many data centers face cooling challenges, and data centers housing large numbers of miners or other CPU- or GPU-based systems used for compute intensive workloads (e.g., rendering, AI, machine learning, scientific simulation, data science) have even greater cooling challenges. This is due to the significantly higher density, power usage, heat generation, and duty cycle common to these devices and workloads.

The heat in data centers can often exceed the cooling ability of a computing device's built-in fans, which force air across heat sinks on the computing device in order to extract and exhaust the waste heat. Traditional methods for improving cooling of computing devices in data centers include mixing in refrigerated air to reduce the temperature of the air that is forced across the computing device by its built-in cooling fans. A significant drawback to this approach is that refrigeration uses significant amounts of energy on top of the energy already used by the computing devices themselves.

For these reasons, new data center architectures have been designed to dramatically improve airflow so that ambient air can be used for cooling most if not all of the year based on the location of the data center. One drawback to these improved airflow designs occurs during winter when the ambient air temperature drops so low that the computing devices begin to perform poorly. Some data centers may use heat pumps or furnaces to preheat the air incoming to the data center or mixing chambers with recirculating ductwork and valves that mix the exhaust heat from the computing devices with the incoming air to raise the temperature. However, heating the air with heat pumps or furnaces is not energy efficient, and using mixing chambers with recirculating ductwork can negatively impact airflow.

For at least these reasons, there is a desire for a solution that efficiently cools computing devices and efficiently maintains temperatures above undesirable levels when ambient temperatures are low.

SUMMARY

A method for managing airflow for computing devices (e.g., in a data center) is contemplated. In one embodiment, the method comprises positioning the plurality of computing devices on one or more racks. Each of the computing devices on each of the racks has a cooling fan configured to generate an airflow through the computing device from a cold aisle to a hot aisle. The computing devices may be connected via a network, and computing workloads may be distributed to the computing devices via the network. Work is performed on the computing workloads by the computing devices, and one or more temperatures are periodically measured (e.g., ambient temperatures, cool aisle temperatures, forecasted temperatures).

In response to the measured temperatures being below a predetermined threshold, the airflow in at least a subset of the computing devices may be reversed (e.g. from hot aisle to cold aisle versus from cold aisle to hot aisle). The cooling fans may be configured to rotate in a first direction to generate the airflow from the cold aisle to the hot aisle, and in a second direction when reversed to generate the airflow from the hot aisle to the cold aisle. In other embodiments, a subset of the computing devices may be rotated by 180 degrees to reverse the airflow.

In some embodiments, the subset of the computing devices may be less than 30 percent of the total number of computing devices (e.g., varying from 0 to 30 percent in an inverse relationship to the measured temperature).

In some embodiments, the subset of computing devices may be spaced apart horizontally and or vertically from each other by at least one computing device that is not in the subset. They may also be spaced evenly on the racks or scattered substantially evenly across the racks.

In some embodiments, the computing devices in the subset may be periodically changed. The subset of computing devices may for example be selected based on a pattern, and the pattern may shift or change periodically over time.

In some embodiments, the fan speed of one or more of the devices in the subset and or one or more of the computing devices that are not in the subset may be adjusted. For example, the fan speed of a set of computing devices not in the subset but neighboring one or more of the computing devices in the subset may be adjusted to create the desired airflow.

In some embodiments, when a measured temperature is above a predetermined threshold (e.g., once or for longer than a predetermined time period), the reversed airflow may be undone (i.e., with all or some of the computing devices in the selected subset reverting back to normal airflow).

A system for managing computing devices (e.g., in a data center) is also contemplated. In one embodiment, the system may comprise a number of racks configured to hold the computing devices. An air barrier may be connected to the racks to separate hot aisles from cold aisles and may have openings configured to permit air to be drawn through the computing devices by cooling fans and exhausted out of the computing devices through the air barrier. One or more temperature sensors may be configured to periodically measure temperatures for the air being drawn into the computing devices.

A controller may be included in the system and configured to select a subset of the computing devices for air flow reversal in response to the measured temperatures being below a predetermined threshold (e.g., once or for a predetermined time period). In some embodiments, the controller may be configured to select the subset based on a time-varying and temperature-varying pattern. The controller may also be configured to periodically adjust fan speeds for the computing devices based on the measured temperature and the pattern.

The foregoing and other aspects, features, details, utilities, and/or advantages of embodiments of the present disclosure will be apparent from reading the following description, and from reviewing the accompanying drawings.

BRIEF DESCRIPTION OF THE DRAWINGS

FIGS. 3A-C are top views of a portion of a pod housing computing devices in a data center according to the teachings of the present disclosure.

FIG. 4 is a top view of a pod housing computing devices in a data center according to the teachings of the present disclosure.

DETAILED DESCRIPTION

Reference will now be made in detail to embodiments of the present disclosure, examples of which are described herein and illustrated in the accompanying drawings. While the present disclosure will be described in conjunction with embodiments and/or examples, it will be understood that they do not limit the present disclosure to these embodiments and/or examples. On the contrary, the present disclosure covers alternatives, modifications, and equivalents.

Various embodiments are described herein for various apparatuses, systems, and/or methods. Numerous specific details are set forth to provide a thorough understanding of the overall structure, function, manufacture, and use of the embodiments as described in the specification and illustrated in the accompanying drawings. It will be understood by those skilled in the art, however, that the embodiments may be practiced without such specific details. In other instances, well-known operations, components, and elements have not been described in detail so as not to obscure the embodiments described in the specification. Those of ordinary skill in the art will understand that the embodiments described and illustrated herein are non-limiting examples, and thus it can be appreciated that the specific structural and functional details disclosed herein may be representative and do not necessarily limit the scope of the embodiments.

Figure 1:
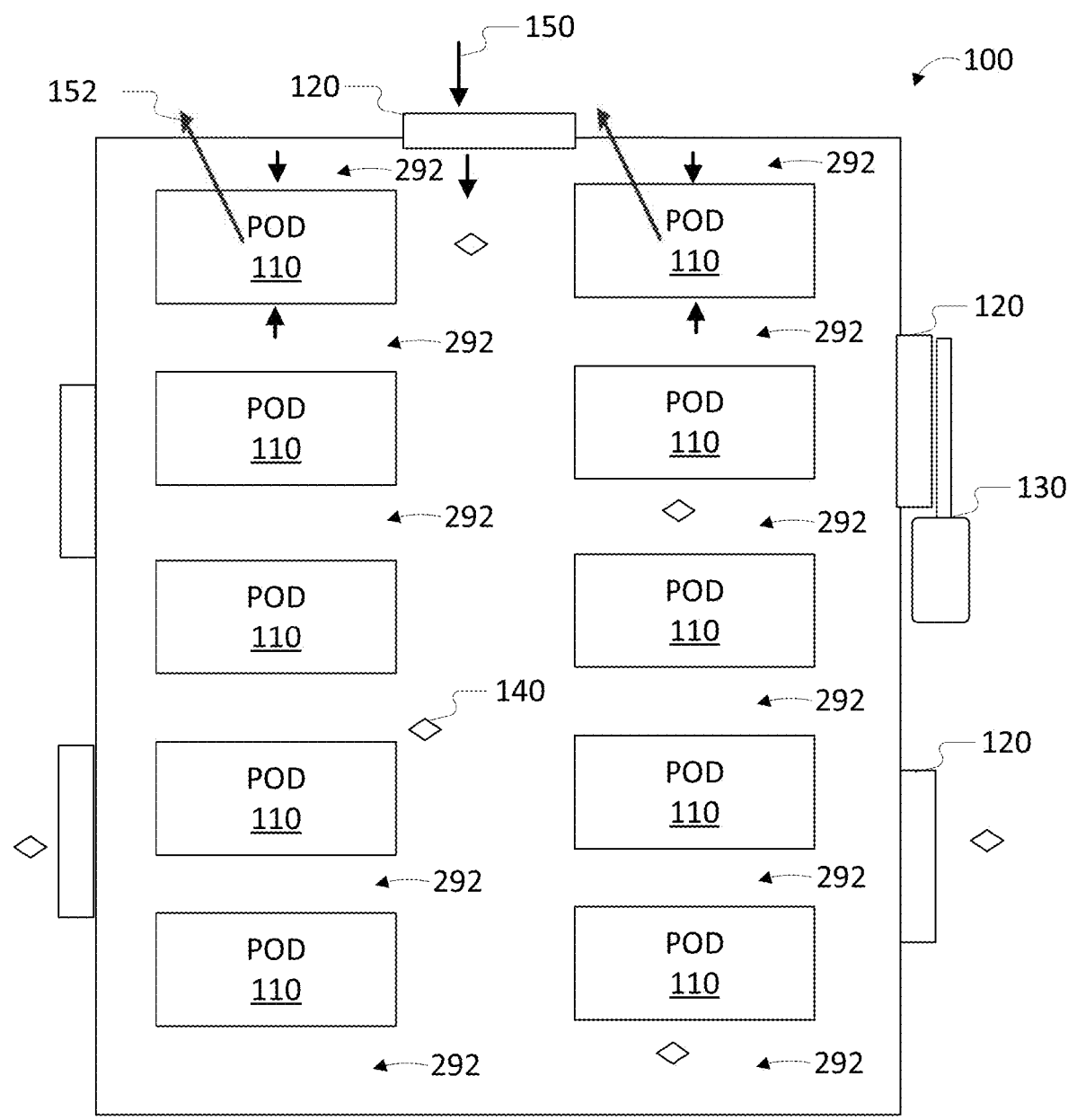
FIG. 1 is a top-down view of one example embodiment of a data center for computing devices.

Referring now to FIG. 1, a top-down view of one example of a data center 100 for computing devices is shown. The data center 100 is configured with one or more pods 110. Pods are standardized blocks of racks, either in a row or (more typically) a pair of rows that share some common infrastructure elements like power distribution units, network routers/switches, containment systems, and air handlers. For example, a pod may have two parallel racks of devices, spaced apart and each facing outwards. The devices on the racks may all be oriented to pull cool air in from outside the pod and discharge the hot air (heated by the computing devices) into the empty space in the center of the pod where the hot air then rises up and out of the data center. For example, there may be one or more exhaust openings (e.g., positioned above the center of each pod) to capture the hot waste air and then discharge it out of the data center via vents in the roof of the data center.

Cool air is drawn into the data center 100 through vents (e.g., vent 120). This air flow represented by arrows including arrow 150. The vents may be adjustable (e.g. via dampers or louvers) so that airflow can be controlled (e.g., restricted or blocked) as needed. Once the air is inside data center 100, it is drawn through cold aisles 292 into the sides of pods 110 as indicated and then expelled out of the data center via an exhaust opening (e.g., out the top and middle of pod 110 as indicated by arrow 152). One or more environmental sensors 140 may be located inside and or outside the data center. These sensors may be network-enabled (e.g., wireless) and provide various environmental data such as temperature, humidity, barometric pressure, wind speed, wind direction, and solar radiation levels (e.g., cloudiness). A subset of these sensors may be located inside the data center, for example, in the cold aisles where cold air is drawn into the pods 110. Another subset of the sensors may be located outside the data center 100, e.g., on different sides of the data center near different air intake vents. This enables the sensors to record environmental data that may vary on the different sides of the data center. For example, at certain times of the day temperatures on one side of the data center may be higher than temperatures on another side of the data center. This may be due to the angle of the sun striking that area outside the data center, or due to shade from nearby trees or structures. In these cases, it may be beneficial to open the vents on the cooler side of the data center and close the vents on the hotter side of the data center.

Some of the external air vents may have an associated cooling unit 130 that may be turned on as needed to reduce the temperature of the incoming outside air. For example, these may include refrigerated air units or misters or humidifiers that can be turned on during particularly hot days when the outside air is too warm to effectively cool the computing devices in pods 110.

In some embodiments, the volume of air inside data center 100 may be significant (much larger than shown in the figure). In these embodiments, there may be a significant delay in the change in air temperature of the air entering a pod relative to a change in the air temperature entering a vent 120. Depending on the configuration of the data center 100, significant mixing of the internal and external air may occur before being drawn into pod 110. Some data centers may be configured with baffles or adjustable vents and fans to encourage this mixing. By placing a number of environmental sensors 140 in different locations in data center 100, this mixing and progression of air temperatures maybe tracked over time.

Figure 2:
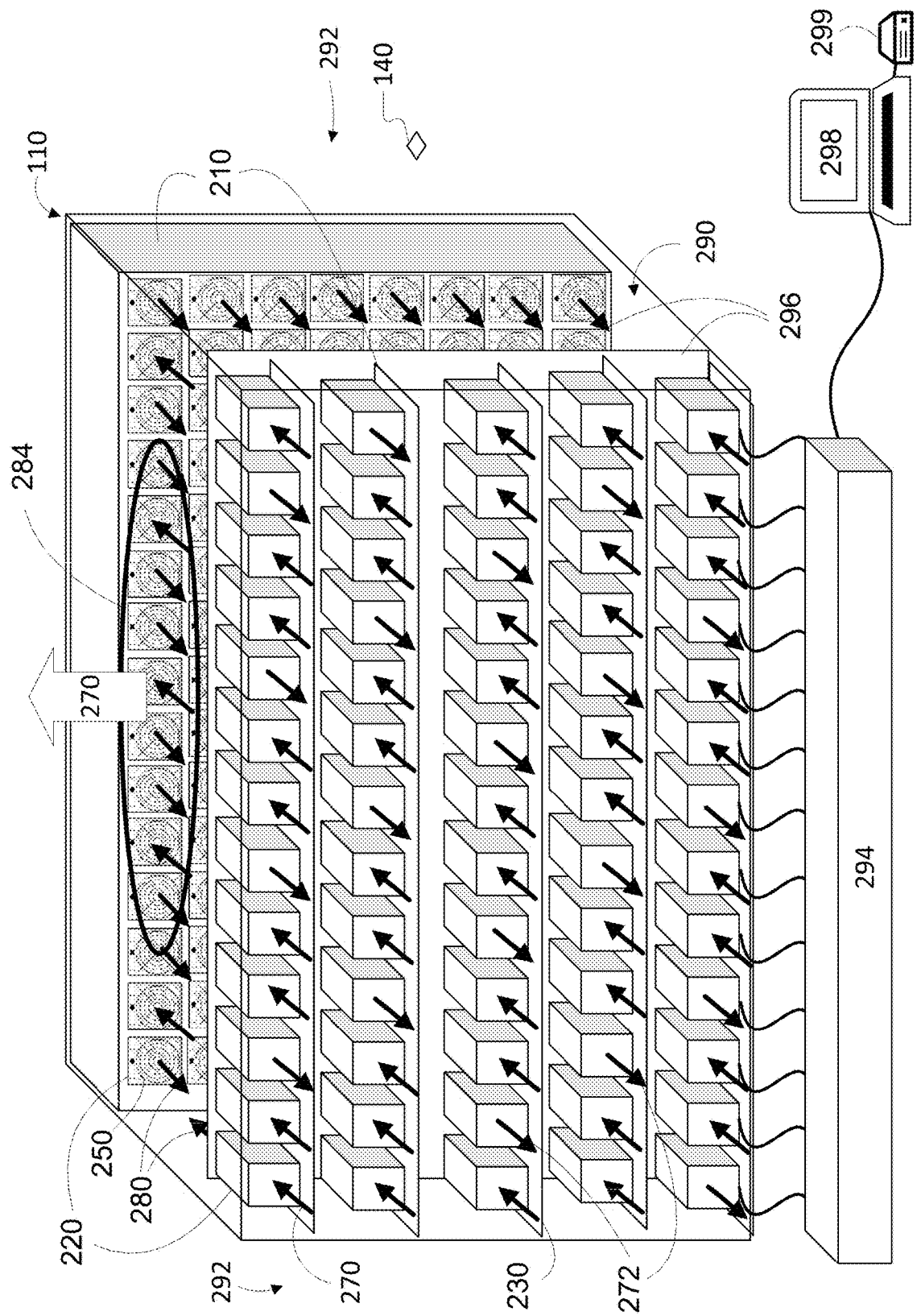
FIG. 2 is a perspective view of one example embodiment of a pod housing computing devices in a data center according to the teachings of the present disclosure.

Turning now to FIG. 2, a perspective view of one example of a pod 110 is shown. This example of pod 110 has racks 210 that each have a number of shelves 230 for holding computing devices 220, thereby creating a two-dimensional array of computing devices on each rack or group of racks. In other embodiments, racks 210 may have rails that hold computing devices 220 in place of shelves 230. Each computing device 220 has one or more cooling fans 250 configured to generate airflow through the computing device for cooling by drawing in air from outside the pod as shown by arrow 270. The moving air draws heat from computing device 220 and is exhausted from the computing devices as shown by arrows 280.

In some embodiments, computing devices 220 may have two fans, one on the intake side and one on the exhaust side. In other embodiments multiple smaller fans may be used within computing device 220. Heated air is exhausted by computing devices 220 into the space between racks 210 called a hot aisle 290. The hot aisle 290 is typically sealed except for one or more exhaust openings through which the heated air exits. In some embodiments, these openings may be on the side (e.g. ends) of the pod 110. In other embodiments as shown, the exhaust openings 284 may be located at the top of hot aisle 290 with the heated air exiting above the pod as indicated by arrow 270. In some embodiments, computing devices 220 are positioned adjacent to an air barrier 296 with openings large enough to allow the heated exhaust air from each computing device 220 to pass into hot aisle 290 but not escape out of hot aisle 290 other than through the exhaust vents. For example, the hot aisle 290 may be sealed except for exhaust opening 284 to ensure that hot air normally only exits through exhaust opening 284. However, complete sealing is not required, and some minor leakage of hot air from the hot aisles to cold aisles and vice versa is may occur (e.g., around access doors to the hot aisle, around vent seals, and around the edges of the computing devices 220 and the air barrier 296 by the exhaust openings 284) without substantially negatively impacting performance.

Computing devices 220 are networked together with network switch 294 and may be organized by mapping physical computing device positions within the pod, rack and shelf by the network ports on switch 294. This network connection allows management instructions and computing jobs to be sent (e.g., from controller 298) to each computing device 220, and data such as device status information (e.g., temperature information) and results of the computing jobs to be returned. Example computing jobs, also called workloads, include solving blocks or calculating hashes for blockchain networks, performing scientific simulations, image processing for artificial intelligence and machine learning, and graphics rendering. Switch 294 may also be connected to other networks such as the internet, as well as a controller 298 that is configured to execute a management application (e.g. stored on computer readable media 299) to manage computing devices 220. Controller 298 may be a traditional PC or server, or specialized appliance. Controller 298 may be configured with one or more processors, volatile memory and non-volatile memory such as flash storage or internal or external hard disk (e.g., network attached storage). The management application or module is preferably implemented in software (e.g., instructions stored on a non-volatile storage medium such as a hard disk, flash drive, or DVD-ROM), but hardware implementations are possible. Software implementations of the management application may be written in one or more programming languages or combinations thereof, including low-level or high-level languages, with examples including Java, Ruby, JavaScript, Python, C, C++, C #, or Rust. The program code may execute entirely on the controller 298 as a stand-alone software package, partly on the management computer/controller 298 and partly on a remote computer or computing devices 220, or entirely on a remote computer or computing devices 220.

In order to better cool computing devices 220, the management application may be configured to dispatch instructions to computing devices 220 setting their fan speeds according to one or more predetermined patterns as described in greater detail below. While different computing devices will have different interfaces for setting fan speed, one example is that the computing device will have a network port open that will accept management commands such as setting the fan speed, voltage level, operating frequency, etc. The management application may provide a user interface for simplified management. For example, the management application may be configured to create a model of the data center based on device to port mappings and permit the user to specify a maximum setting (e.g., maximum fan setting), a minimum setting (e.g., minimum fan settings), and a type of pattern (e.g., linear gradient or cubic). With this information the management application may then automatically calculate the values (e.g., fan speed settings) for each computing device based on the distribution of the computing devices on the rack. The management application may also prompt the user to specify timing and the direction for any desired shifts or rotations of the patterns.

While the illustrated examples show the computing devices 220 arranged in two-dimensional arrays that are planar and perpendicular to the floor, other arrangements are possible and contemplated. For example, the two-dimensional array may be sloped or angled relative to the floor (e.g., with each shelf angled and or offset from the one below it) and or non-planar (e.g., with each shelf angled and or offset from the one next to it).

In some embodiments, controller 298 may be connected (e.g., wirelessly) to one or more environmental sensors 140. Controller 298 may be configured to periodically read temperature data for cold aisles 292 and or ambient temperatures external to the data center. Controller 298 may also be configured to access weather forecast data (e.g., from an Internet-based weather web service). In response to the measured temperature (or the predicted temperature according to the weather forecast), being below a predetermined threshold, the controller 298 may be configured to reverse the airflow in one or more of computing devices 220. This allows mixing of the hot air from the hot aisle with the cool ambient air from the cool aisle to bring up the cool temperature to a more acceptable range. For example, some computing devices have a recommended operating temperature range or optimal operating temperature range for performance of 0° C.-40° C., so the predetermined threshold maybe 0° C. for more than 30 minutes or a weather forecast predicting low temperatures at or below 0° C. for a significant period of time such as several hours.

In some embodiments, the airflow is reversed by changing the rotational direction of the cooling fans 250. The cooling fans 250 may be configured to rotate in a first direction to generate airflow from the cold aisle to the hot aisle, and in a second direction to generate airflow from the hot aisle to the cold aisle. Some computing devices may have bidirectional fans, while others may be retrofitted with controllable switches connected to the power connector of the fan to enable direction reversal. For example, the controllable switches may be network controllable (e.g., Bluetooth, wifi or ethernet) or they may be connected to ports in the computing device (e.g., USB, RS-232, PCI, etc.) that can be accessed and controlled by controller 298. In other embodiments, the airflow may be reversed by rotating one or more of the computing devices 220 by 180 degrees. The computing devices 220 may for example be mounted on motorized rotatable turntables or platforms controllable by controller 298, or they may be manually rotated by data center staff according to tickets generated by the controller 298 that identify which computing devices 220 to rotate and when (e.g., in the event of controller 298 detecting an incoming cold front indicated by a weather forecast).

In some embodiments, the number of computing devices 220 that have their airflow reversed may vary (e.g., in an inverse relationship) with the measured or predicted temperature. For example, if the measured or predicted ambient temperature is above 0° C., no computing devices 220 maybe reversed, but if the measured or predicted ambient temperature is −20° C., 30% of computing devices 220 may be reversed. In addition to the temperature, maintaining a desired minimum pressure differential between the hot aisle and cold aisle me be desirable. In some embodiments, controller 298 may be configured to adjust the fan speed of one or more of the computing devices 220 (e.g., computing devices with reversed airflow, computing devices with normal airflow, or both) in combination with reversing the airflow of some of computing devices 220 in order to maintain that desired minimum pressure differential. In some embodiments, limiting the number of computing devices with reversed airflow (e.g., less than 30%) may help with maintaining that desired minimum pressure differential and to assist with air mixing. For example, the fan speed of computing devices that are not reversed but that are neighboring he reversed computing device may be lowered to allow more hot air to travel back into cold aisle 292.

In some embodiments, the subset of computing devices 220 that have their flow reversed maybe spaced apart from each other to ensure even mixing of hot air with the cold air in the cold aisle. For example, if all the computing devices 220 with reversed airflow were bunched together in one location in the pod, computing devices far away from that location may not benefit from the mixing of the hot air and the cold air in the cold aisle. This spacing may be horizontal and or vertical relative to the reversed computing devices' position on the rack. This is shown by arrows 272 which indicate reversed airflow and illustrate the separation of devices with reversed airflow from other reversed computing devices by at least one computing device in normal (cold aisle to hot aisle) air flow mode, both horizontally and vertically.

Controller 298 may be configured to select which computing device is 220 should be reversed based on a pattern (e.g., every third computing device on a shelf, with subsequent shelves being offset as shown to improve spacing between the computing devices with reversed airflow). In some embodiments, controller 298 may be configured to scatter the computing devices with reversed airflow substantially evenly or randomly across the racks in the pod, and controller 298 may periodically change which of the computing devices are in a subset to further improved mixing uniformity over time. For example, controller 298 may shift the pattern of reversed air flow computing devices shown in FIG. 2, horizontally every 5 to 10 minutes or whenever hot spots are detected based on temperature readings from the computing devices 220. In other embodiments, controller 298 may use a predetermine time-varying and temperature-varying pattern that has been calibrated for the particular dimensions and configuration of the particular data center and the type of computing devices and workloads operating therein.

In some embodiments, once temperatures are measured that are above the predetermined threshold (e.g., for a predetermined amount of time) or a weather forecast indicative of such temperatures is received, the controller 298 may be configured to undo the reversing of the air flow in the computing devices. In some embodiments, this may be performed dynamically based on the measured temperatures, e.g., by slowly reducing the number of reversed computing devices 220 as the measured temperature increases.

Turning now to FIGS. 3A-C, top views of a portion of a shelf in a rack in a pod housing computing devices in a data center according to the teachings of the present disclosure are shown. In FIG. 3A, computing devices 220 are operating in their normal mode by pulling in cool air from cold zone 292 through openings in air barrier 296 and expelling it into hot zone 290 as indicated by arrow 310. In FIG. 3B, computing device 220A is operating in a reversed airflow mode by pulling in hot air from hot zone 290 through openings in air barrier 296 and expelling it into cold zone 292 as indicated by arrow 320. In FIG. 3C, computing devices 220B and 220C are both operating in a reversed airflow mode by pulling in hot air from hot zone 290 through openings in air barrier 296 and expelling it into cold zone 292 as indicated by arrows 330 and 340.

Turning now to FIG. 4, a top view of a pod 110 housing computing devices 220 in a data center according to the teachings of the present disclosure is shown. In this embodiment, computing devices 220F and 220G are configured in reverse airflow mode drawing hot air from hot aisle 290 and expelling it into cold aisles 292 through openings in air barrier 296 as shown by arrows 430 while the other computing devices are configured in normal mode and drawing air in from cold aisles 292 (as shown by arrow 410) and expel hot air into hot aisle 290 (as shown by arrow 420). In this example, the remaining computing devices 220 have been configured with different fan speeds according to a pattern by the controller. The pattern comprises reduced fan speeds for the computing devices near the computing devices 220F and 220G as indicated by the length of arrow 422. Computing devices 220 that are not near computing devices 220F and 220G have a normal fan speed as indicated by the length of arrow 420.

Figure 5:
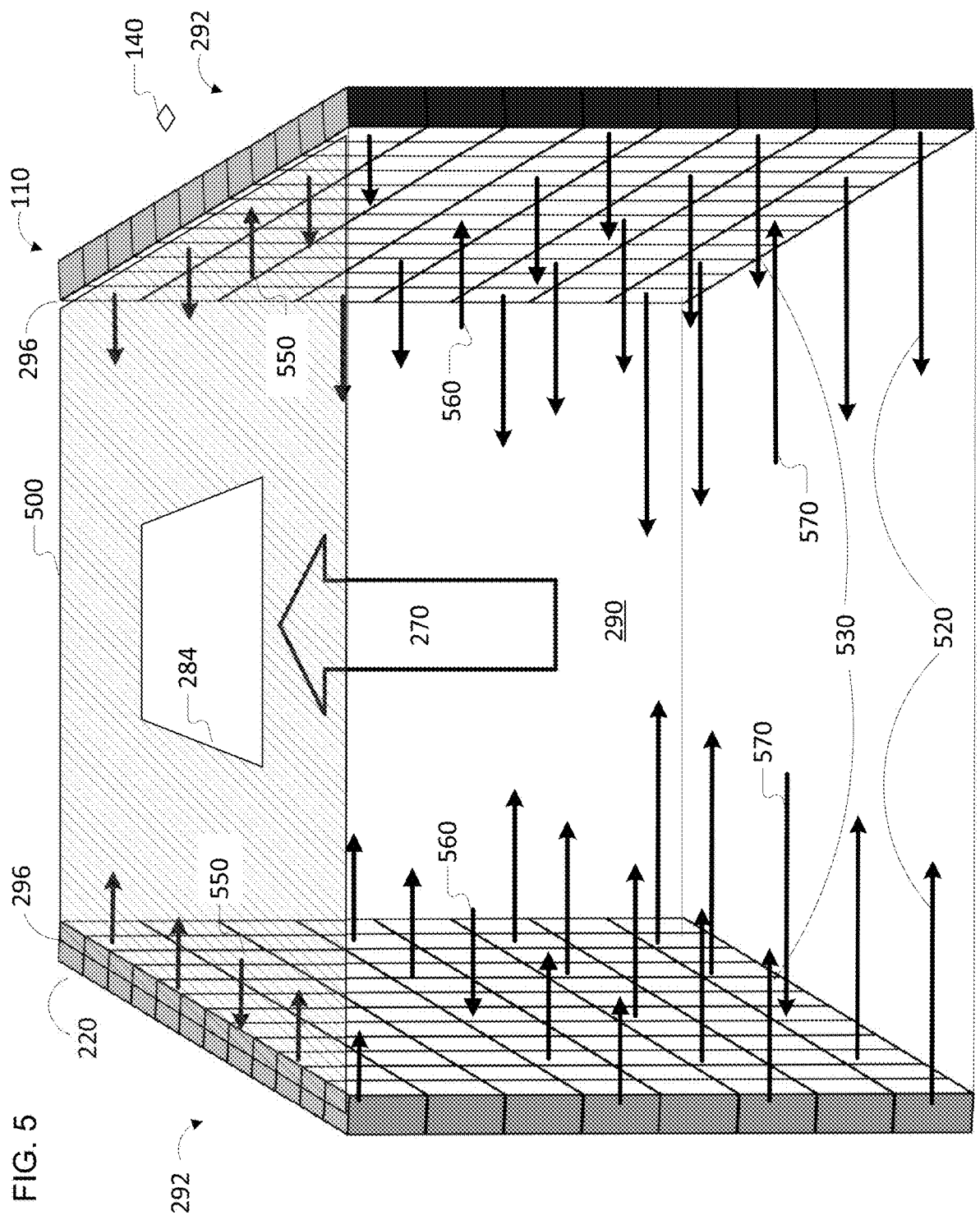
FIG. 5 is a perspective view of an example embodiment of a fan cooling pattern applied to an example pod in a data center according to the teachings of the present disclosure.

Turning now to FIG. 5, a perspective view of an example embodiment of a fan cooling pattern applied to an example pod 110 in a data center according to the teachings of the present disclosure is shown. In this embodiment, computing devices 220 that are farther away from exhaust vent 284 are configured according to a fan speed pattern with higher fan speeds (indicated by a longer arrows 520) than computing devices 220 that are closer (indicated by shorter arrows 530). Several computing devices are configured in reverse airflow mode following a similar pattern, as indicate by arrows 550, 560 and 570. Other patterns are possible and contemplated, such as uniform fan speeds that vary over time or vary based on the temperature readings of computing devices 220 and or environmental sensor 140.

Figure 6:
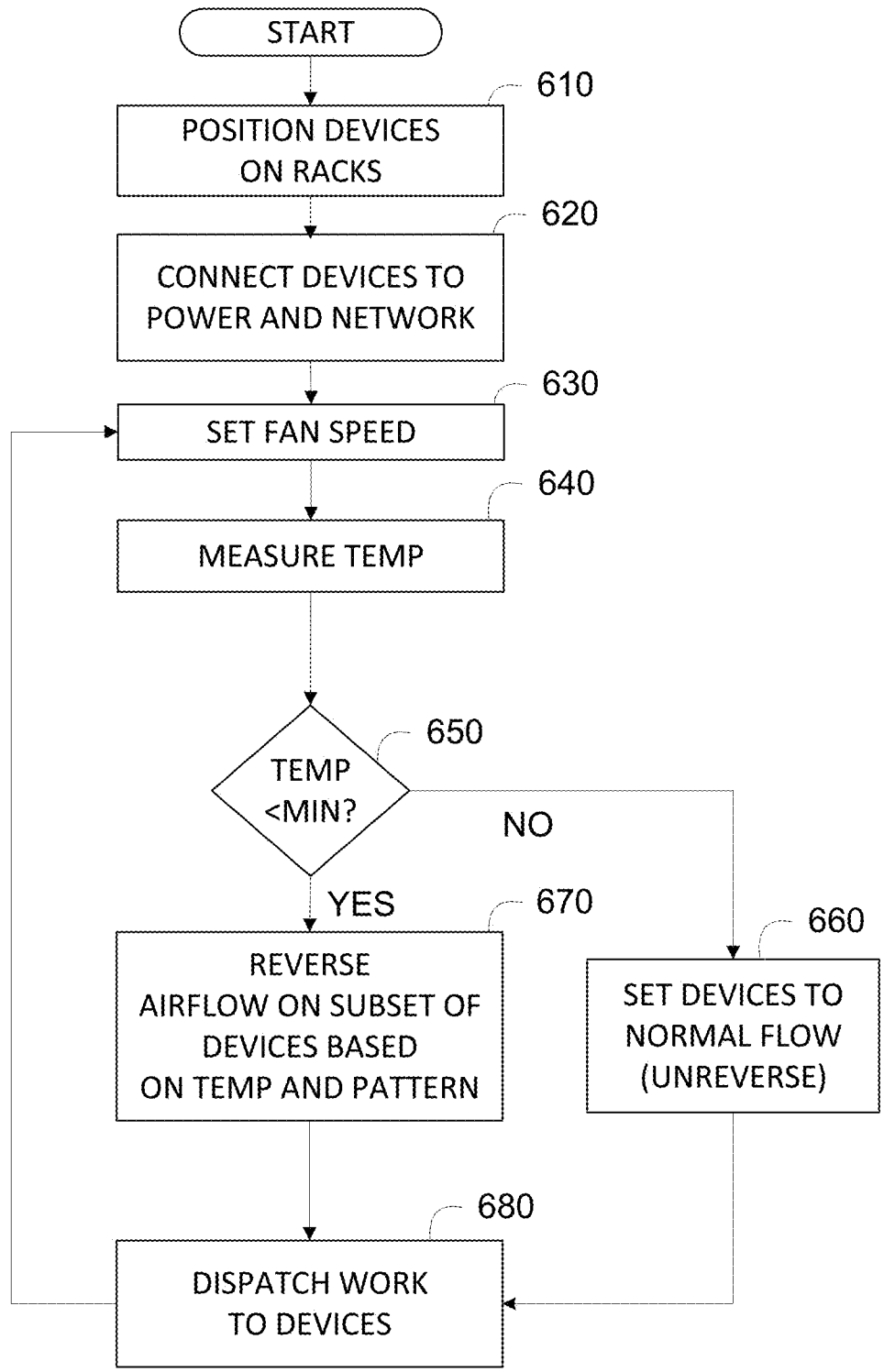
FIG. 6 is a flowchart of an example embodiment of a method for managing airflow for computing devices according to the teachings of the present disclosure.

Turning now to FIG. 6, a flowchart of an example embodiment of a method for managing airflow for computing devices according to the teachings of the present disclosure is shown. In this environment, the computing devices are positioned on one or more racks (step 610). The devices are connected to power and network connections (step 620). Cooling fan speeds for the computing devices are set (step 630), e.g., based on a pattern or predetermined default setting or device temperature. Temperature data is measured (step 640), e.g., by reading an environmental sensor or by gathering data from a networked weather forecasting source. If the measured temperature is below a predetermined desired minimum threshold (step 650), a subset of the computing devices may have their air flow reversed (step 670). For example, this may be based on a predetermined pattern and or on the measured temperature data. Work is dispatched to the computing devices (step 680), and fan speeds are adjusted as needed based on the computing devices temperature (step 630). Many computing devices have internal thermostats that indicate for example the processor or motherboard temperature to ensure safe operation. If the measured temperature is not below the predetermined minimum (step 650), any devices that have been configured in reverse airflow mode maybe unreversed or reset to normal airflow mode (step 660).

Reference throughout the specification to "various embodiments," "with embodiments," "in embodiments," or "an embodiment," or the like, means that a particular feature, structure, or characteristic described in connection with the embodiment is included in at least one embodiment. Thus, appearances of the phrases "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such elements. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." and "for example" in the specification is to be construed broadly and is used to provide non-limiting examples of embodiments of the disclosure, and the disclosure is not limited to such examples. Uses of "and" and "or" are to be construed broadly (e.g., to be treated as "and/or"). For example, and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that a computer, a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. A method for managing airflow for a plurality of computing devices, the method comprising:
    positioning the plurality of computing devices on one or more racks, wherein each of the computing devices on each of the racks comprises a cooling fan configured to generate an airflow through the computing devices from a cold aisle to a hot aisle;
connecting the computing devices via a network;
distributing computing workloads to the plurality of computing devices via the network;
performing work on the computing workloads on the plurality of computing devices;
periodically measuring a temperature; and
in response to the measured temperature being below a predetermined threshold for a predetermined amount of time, reversing the airflow in a subset of the computing devices;
wherein periodically measuring the temperature includes: measuring a cold aisle temperature of the cold aisle, and/or measuring an external air temperature of an environment surrounding a data center in which the plurality of computing devices are disposed.

2. The method of claim 1, wherein the cooling fan is configured to rotate in a first direction to generate the airflow from the cold aisle to the hot aisle and in a second direction to generate the airflow from the hot aisle to the cold aisle, wherein the reversing comprises causing the cooling fan to rotate in the second direction.

3. The method of claim 1, wherein the reversing comprises rotating the subset of the computing devices by 180 degrees.

4. The method of claim 2, wherein the subset of the computing devices comprises less than 30 percent of the plurality of computing devices.

5. The method of claim 2, wherein each of the subset of the computing devices is spaced apart horizontally from each other by at least one computing device not in the subset.

6. The method of claim 1, further comprising controlling the airflow in the subset of computing devices and computing devices not in the subset to maintain a minimum pressure differential between the hot aisle and the cold aisle.

7. The method of claim 2, wherein:
each of the subset of the computing devices is spaced apart horizontally and vertically from each other by at least one computing device not in the subset; or
each of the subset of the computing devices are scattered randomly across the racks and changed at regular time intervals to improve mixing uniformity.

8. The method of claim 1, further comprising obtaining a predicted temperature; and
in response to the predicted temperature being below the predetermined threshold, reversing the airflow in the subset of the computing devices.

9. The method of claim 1, wherein the plurality of computing devices are disposed in a data center; and
the method further comprises:
obtaining environmental data from exterior sensors disposed outside the data center; and
closing external vents on a hotter side of the data center.

10. The method of claim 2, further comprising selecting the subset of the computing devices based on a pattern, wherein the pattern shifts over time.

11. The method of claim 1, further comprising selecting the subset of the computing devices based on a predetermined pattern.

12. The method of claim 11, wherein the predetermined pattern includes a time-varying and temperature-varying pattern calibrated for a type or types of the computing devices and the computing workloads.

13. The method of claim 1, further comprising adjusting a speed of the cooling fan of one or more of the plurality of computing devices that are not in the subset and that are neighboring one or more of the computing devices in the subset.

14. The method of claim 1, further comprising, in response to the measured temperature being above a second predetermined threshold, dynamically undoing the reversing the airflow in the subset of the computing devices by slowly reducing a quantity of reversed airflow computing devices as the measured temperature rises.

15. The method of claim 1, wherein the subset of the computing devices has a quantity that varies from 0% to 30% of the plurality of computing devices, wherein the quantity has an inverse relationship with the measured temperature.

16. A system for managing a plurality of computing devices, the system comprising:
a plurality of racks configured to hold the plurality of computing devices, wherein each computing device comprises a cooling fan;
an air barrier connected to the racks and comprising a plurality of openings configured to permit air to be drawn through the computing devices by the cooling fans;
a temperature sensor configured to periodically measure temperatures for the air being drawn into the computing devices; and
a controller configured to select a subset of the plurality of computing devices for air flow reversal in response to the measured temperatures being below a predetermined threshold; and
wherein the controller is further configured to control the cooling fan of at least some of the computing devices to maintain a desired minimum pressure differential between the hot aisle and the cold aisle.

17. The system of claim 16, wherein the controller is configured to select the subset based on a time-varying and temperature-varying pattern.

18. The system of claim 17, wherein the controller is configured to periodically adjust fan speeds for the computing devices based on the measured temperature and the pattern;
wherein the pattern is predetermined and calibrated to a type or types of the plurality of computing devices.

19. The system of claim 16, wherein the controller is configured to adjust a fan speed of the cooling fan of the subset of the plurality of computing devices and/or other computing devices not in the subset to maintain the desired minimum pressure differential.

20. A method for managing airflow for a plurality of computing devices, the method comprising:
positioning the plurality of computing devices on one or more racks, wherein each of the computing devices on each of the racks comprises a cooling fan configured to generate an airflow through the computing devices from a cold aisle to a hot aisle;
connecting the computing devices via a network;
distributing computing workloads to the plurality of computing devices via the network;
performing work on the computing workloads on the plurality of computing devices;
periodically measuring a temperature;
in response to the measured temperature being below a predetermined threshold for a predetermined amount of time, reversing the airflow in a subset of the computing devices; and controlling the airflow in the subset of computing devices and computing devices not in the subset to maintain a desired minimum pressure differential between the hot aisle and the cold aisle.

* * * * *